(12) United States Patent
Maeda

(10) Patent No.: US 11,989,006 B2
(45) Date of Patent: May 21, 2024

(54) PROCESSING SYSTEM AND METHOD FOR MANUFACTURING METAL MEMBER

(71) Applicant: Sumitomo Electric Sintered Alloy, Ltd., Takahashi (JP)

(72) Inventor: Kazuo Maeda, Takahashi (JP)

(73) Assignee: SUMITOMO ELECTRIC SINTERED ALLOY, LTD., Takahashi (JP)

(*) Notice: Subject to any disclaimer, the term of this patent is extended or adjusted under 35 U.S.C. 154(b) by 88 days.

(21) Appl. No.: 17/640,350

(22) PCT Filed: Aug. 31, 2020

(86) PCT No.: PCT/JP2020/032920
§ 371 (c)(1),
(2) Date: Mar. 4, 2022

(87) PCT Pub. No.: WO2021/045013
PCT Pub. Date: Mar. 11, 2021

(65) Prior Publication Data
US 2022/0342390 A1 Oct. 27, 2022

(30) Foreign Application Priority Data
Sep. 6, 2019 (JP) .................... 2019-163220

(51) Int. Cl.
*G05B 19/4155* (2006.01)
*B23Q 17/09* (2006.01)
*G01R 19/10* (2006.01)

(52) U.S. Cl.
CPC ......... *G05B 19/4155* (2013.01); *B23Q 17/09* (2013.01); *G01R 19/10* (2013.01); *G05B 2219/41329* (2013.01)

(58) Field of Classification Search
CPC ..................................................... B23Q 17/09
See application file for complete search history.

(56) References Cited

U.S. PATENT DOCUMENTS 5,773,949 A * 6/1998 Nagatomi .......... G05B 19/4065
318/434
6,925,725 B2 * 8/2005 Herrmann ............. B23Q 17/20
408/11
(Continued)

FOREIGN PATENT DOCUMENTS

EP        3715048 B1 *  3/2022  ............. B23Q 15/12
JP     H10-286743 A    10/1998
(Continued)

*Primary Examiner* — Jason L Vaughan
(74) *Attorney, Agent, or Firm* — XSENSUS LLP

(57) ABSTRACT

A processing system comprises a tool that processes a workpiece composed of a metal member, a motor that rotates the workpiece or the tool, a control unit that controls the motor, and a measurement unit that obtains an electrical quantity of the motor, wherein the control unit changes a rotational speed of the motor based on a difference between a first electrical quantity and a second electrical quantity, the first electrical quantity is an electrical quantity obtained by the measurement unit while the motor rotates before the workpiece is processed, and the second electrical quantity is an electrical quantity obtained by the measurement unit while the workpiece is processed.

18 Claims, 3 Drawing Sheets

(56) References Cited

U.S. PATENT DOCUMENTS

| | | | | |
|---|---|---|---|---|
| 7,719,218 | B2 * | 5/2010 | Iwashita | B23Q 17/09 |
| | | | | 318/434 |
| 9,079,280 | B2 * | 7/2015 | Lange | B23Q 17/0957 |
| 2012/0128439 | A1 * | 5/2012 | Mayor | B23Q 17/09 |
| | | | | 409/193 |
| 2021/0053170 | A1 * | 2/2021 | Sim | G05B 19/4065 |

FOREIGN PATENT DOCUMENTS

| | | | |
|---|---|---|---|
| JP | 2006-336078 | A | 12/2006 |
| JP | 2010-186374 | A | 8/2010 |
| JP | 2016-193469 | A | 11/2016 |
| JP | 2017-193018 | A | 10/2017 |

* cited by examiner

PROCESSING SYSTEM AND METHOD FOR MANUFACTURING METAL MEMBER

CROSS-REFERENCE TO RELATED APPLICATIONS

The present application is based on PCT filing PCT/JP2020/032920, filed Aug. 31, 2020, which claims priority to Japanese Patent Application No. 2019-163220, filed on Sep. 6, 2019, the entire contents of each are incorporated herein by reference.

TECHNICAL FIELD

The present disclosure relates to a processing system and a method for manufacturing a metal member.

BACKGROUND ART

PTL 1 discloses drilling a sintered component.

CITATION LIST

Patent Literature

PTL 1: Japanese Patent Laid-Open No. 2006-336078

SUMMARY OF INVENTION

The presently disclosed processing system comprises:
a tool that processes a workpiece composed of a metal member;
a motor that rotates the workpiece or the tool;
a control unit that controls the motor; and
a measurement unit that obtains an electrical quantity of the motor, wherein
the control unit changes a rotational speed of the motor based on a difference between a first electrical quantity and a second electrical quantity,
the first electrical quantity is an electrical quantity obtained by the measurement unit while the motor rotates before the workpiece is processed, and
the second electrical quantity is an electrical quantity obtained by the measurement unit while the workpiece is processed.

The presently disclosed method for manufacturing a metal member comprises
processing a workpiece composed of the metal member by using a tool while obtaining by a measurement unit an electrical quantity of a motor that rotates the tool or the workpiece, wherein
the processing includes changing a rotational speed of the motor based on a difference between a first electrical quantity and a second electrical quantity,
the first electrical quantity is an electrical quantity obtained by the measurement unit while the motor rotates before the workpiece is processed, and
the second electrical quantity is an electrical quantity obtained by the measurement unit while the workpiece is processed.

DETAILED DESCRIPTION

Figure 1:
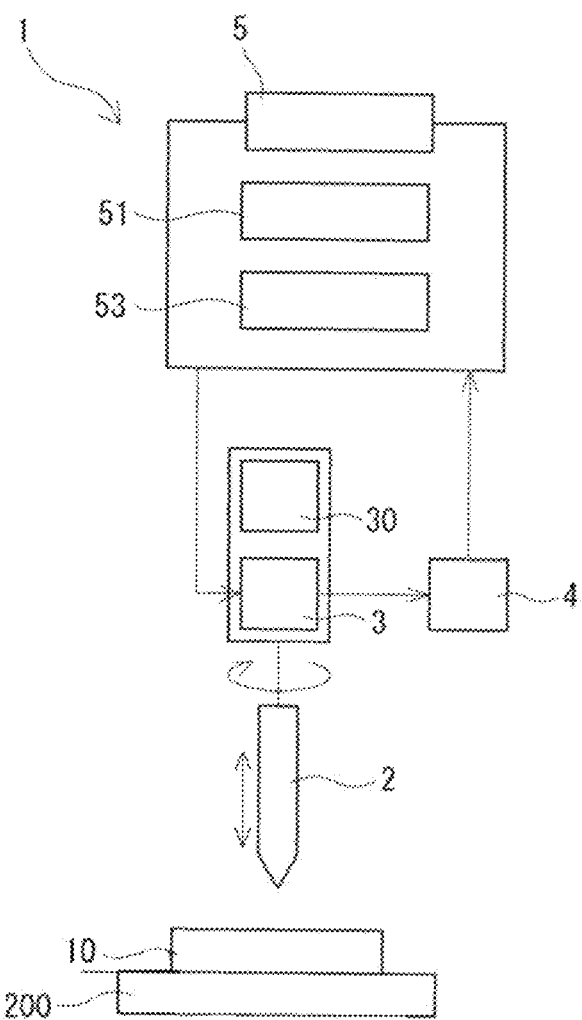
FIG. 1 is a diagram for illustrating a processing system according to an embodiment.

Problem to be Solved by the Present Disclosure

Tools may break while processing a workpiece. If the tool breaks, and subsequently processes a workpiece, the tool loses contact with the workpiece over a large area. If the tool loses contact with the work-piece over an excessively large area, the processing per se of the workpiece is difficult. If it is difficult to process the workpiece, a defective product which has not been subjected to predetermined processing by the tool would be produced.

An object of the present disclosure is to provide a processing system capable of suppressing production of defective products and a method for manufacturing a metal member.

Advantageous Effect of the Present Disclosure

The presently disclosed processing system and method for manufacturing a metal member can suppress production of defective products.

DESCRIPTION OF EMBODIMENTS OF THE PRESENT DISCLOSURE

First, embodiments of the present disclosure will be specified and described.
(1) The presently disclosed processing system comprises:
a tool that processes a workpiece composed of a metal member;
a motor that rotates the workpiece or the tool;
a control unit that controls the motor; and
a measurement unit that obtains an electrical quantity of the motor, wherein
the control unit changes a rotational speed of the motor based on a difference between a first electrical quantity and a second electrical quantity,
the first electrical quantity is an electrical quantity obtained by the measurement unit while the motor rotates before the workpiece is processed, and
the second electrical quantity is an electrical quantity obtained by the measurement unit while the workpiece is processed.

In the following description, "while the motor rotates before the workpiece is processed" means a state in which the tool and the workpiece do not contact each other while the tool is rotated by the motor under the same cutting condition as that when the workpiece is actually processed. It does not matter whether the workpiece is held on a table. Hereinafter, a state while the motor rotates before the workpiece is processed may be simply referred to as a state while the motor idles.

The processing system can suppress production of defective products which have not been subjected to predetermined processing by the tool. This is because the processing system can detect tool breakage from the difference, and when tool breakage is caused, the control unit can change the rotational speed of the motor, as will be described hereinafter. Breakage includes that the tool has a chipped cutting edge, and in addition thereto, also includes that the tool is broken apart.

Tool breakage can be detected from the difference for the following reason: If a tool breaks, it loses contact with a workpiece over a large area. If the tool loses contact with the workpiece over an excessively large area, it is difficult to process the workpiece. This state in which the processing is difficult can be regarded as a state in which the workpiece and the tool substantially idle relative to each other. That is, the second electrical quantity approaches the first electrical quantity, and the difference decreases. The second electrical quantity may be substantially equal to the first electrical quantity, and the difference may be substantially eliminated. As a result, the difference changes from above a threshold value to below the threshold value. Therefore, by obtaining the difference, whether the difference satisfies the threshold value or less can be determined, and whether the tool has broken can be determined. The threshold value will be described hereinafter.

(2) One form of the processing system includes that the first electrical quantity and the second electrical quantity may be at least one of a magnitude of a load current of the motor, a differential value of the load current of the motor, and an integral value of the load current of the motor.

The processing system easily detects tool breakage. This is because at least one of the magnitude, differential value, and integral value of the load current of the motor correlates with tool breakage.

When a tool has broken, the processing per se becomes difficult, and accordingly, a processing resistance acting while the workpiece is processed decreases. When the processing resistance decreases, the motor's load torque decreases, and accordingly, the motor's load current decreases in magnitude. That is, when the tool has broken, the motor's load current while the workpiece is processed decreases in magnitude. Specifically, when the tool is broken apart and does not contact the workpiece, the processing depth is zero (0). As the processing depth is zero, the magnitude, differential value, and integral value of the load current of the motor while the workpiece is processed are substantially equal to the magnitude, differential value, and integral value of the load current of the motor obtained when it idles. When the tool has a chipped cutting edge and still contacts the workpiece, the processing depth decreases. As the processing depth decreases, the magnitude, differential value, and integral value of the load current of the motor while the workpiece is processed relatively decrease, although they do not as much as they do when the tool does not contact the workpiece. That is, the magnitude, differential value, and integral value of the load current of the motor while the workpiece is processed approach the magnitude, differential value, and integral value of the load current of the motor obtained when it idles. Therefore, at least one of the magnitude, differential value, and integral value of the load current of the motor can be used to determine whether the tool is processing the workpiece, that is, whether the tool has broken.

(3) One form of the processing system includes that the control unit zeros the rotational speed of the motor when the difference is equal to or less than the threshold value.

The processing system can prevent continuous production of defective products. This is because the control unit can zero the rotational speed of the motor when the difference is equal to or less than the threshold value, that is, when the tool breaks. When the rotational speed of the motor is zero, the tool or the workpiece is stopped from rotating.

(4) The presently disclosed method for manufacturing a metal member comprises processing a workpiece composed of the metal member by using a tool while obtaining by a measurement unit an electrical quantity of a motor that rotates the tool or the workpiece, wherein the processing includes changing a rotational speed of the motor based on a difference between a first electrical quantity and a second electrical quantity, the first electrical quantity is an electrical quantity obtained by the measurement unit while the motor rotates before the workpiece is processed, and the second electrical quantity is an electrical quantity obtained by the measurement unit while the workpiece is processed.

The method for manufacturing a metal member can suppress production of defective products. This is because, as well as the processing system, the method for manufacturing a metal member can detect tool breakage from the difference, and when tool breakage is caused, the control unit can change the rotational speed of the motor. Further, the method for manufacturing a metal member can improve productivity of the metal member. This is because it is unnecessary to temporarily move the tool to a detector to check for breakage, and the checking operation can thus be eliminated.

DETAILED DESCRIPTION OF EMBODIMENTS OF THE PRESENT DISCLOSURE

An embodiment of the present disclosure will more specifically be described below.

Embodiment

[Processing System]

A processing system 1 according to an embodiment will be described with reference to FIG. 1. Processing system 1 of the present embodiment comprises a tool 2, a motor 3, a measurement unit 4, and a control unit 5. Tool 2 processes a workpiece 10. Motor 3 rotates workpiece 10 or tool 2. Measurement unit 4 obtains an electrical quantity of motor 3. Control unit 5 controls motor 3. One feature of processing system 1 of the present embodiment is that control unit 5 changes the rotational speed of motor 3 based on a difference between a first electrical quantity and a second electrical quantity. The first electrical quantity and the second electrical quantity will more specifically be described hereinafter. In the following description, initially, workpiece 10 will generally be described, and subsequently, each configuration of processing system 1 will specifically be described.

[Workpiece]

Workpiece 10 is a target to be processed by tool 2. Workpiece 10 is not particularly limited in material, type and shape and can be selected as appropriate. Workpiece 10 is typically composed of pure iron, iron alloy, or non-ferrous metal. Workpiece 10 includes a green compact, a sintered compact, an ingot, and the like in type for example. A green compact is obtained by compression-molding a powdery raw material. A sintered compact is obtained by sintering the green compact. An ingot is obtained by solidifying a molten raw material. Workpiece 10 may for example have a simple shape such as a single plate-shaped, columnar or similar body, or a complicated shape such as a plurality of plate-shaped, columnar or similar bodies combined together. When workpiece 10 is processed, it is held on a table 200.

[Tool]

Tool 2 processes workpiece 10. Tool 2 can be selected in type, as appropriate, depending on the type of processing. The type of processing includes milling and turning. For milling, the type of tool 2 includes a rotary tool. For turning, the type of tool 2 includes a tool for turning. Examples of the rotary tool include a drill, a reamer, a tap, and an end mill. Examples of the tool for turning include an insert. In the present embodiment, the type of tool 2 is a drill.

For milling, as performed in the present embodiment, tool 2 is moved in the axial direction of tool 2 by a driving mechanism 30 to advance and thus approach workpiece 10 or retract away from workpiece 10. When tool 2 is an end mill, tool 2 is advanced and retracted by driving mechanism 30 and, in addition, moved horizontally in a direction orthogonal to the axis of rotation of tool 2. For turning, in contrast to the present embodiment, tool 2 is moved by driving mechanism 30 in parallel to the axis of rotation of workpiece 10. Driving mechanism 30 includes a power source and a transmission mechanism that transmits power of the power source to tool 2. The power source is a member that provides power for tool 2 to perform an operation necessary for processing. An example of the power source is a motor. The transmission mechanism can be a known transmission mechanism. For driving mechanism 30, an XYZ table can be used for example. The XYZ table allows tool 2 to be moved to any position on three-dimensional coordinates. The Z direction is a direction in which tool 2 ascends and descends. The XY directions are orthogonal to the direction in which tool 2 ascends and descends. Examples of driving mechanism 30 include a motor, a cylinder, a solenoid, and a ball screw. In the present embodiment, tool 2 is advanced and retracted by a ball screw and a motor. An arrow indicated in FIG. 1 along the longitudinal direction of tool 2 indicates a direction in which tool 2 advances and retracts.

[Motor]

Motor 3 rotates workpiece 10 or tool 2. For milling, as performed in the present embodiment, motor 3 rotates tool 2. For turning, motor 3 rotates workpiece 10. An arrow indicated in FIG. 1 in a circumferential direction of tool 2 indicates a direction in which tool 2 rotates. Tool 2 is also rotatable in a direction opposite to that in which tool 2 rotates as shown in FIG. 1.

[Measurement Unit]

Measurement unit 4 obtains an electrical quantity of motor 3. Examples of the electrical quantity of motor 3 obtained by measurement unit 4 include a first electrical quantity and a second electrical quantity.

The first electrical quantity is an electrical quantity of motor 3 obtained by measurement unit 4 while motor 3 idles. While motor 3 idles, tool 2 and workpiece 10 do not contact each other while tool 2 is rotated by motor 3 under the same cutting condition as that when workpiece 10 is actually processed. It does not matter whether workpiece 10 is held on table 200. The cutting condition includes a cutting speed, a cutting depth, feed, and a cutting time. The second electrical quantity is an electrical quantity of motor 3 obtained by measurement unit 4 while workpiece 10 is processed.

The electrical quantity of motor 3 obtained by measurement unit 4 includes, for example, a value per se obtained by a current sensor, a value correlated with the value obtained by the current sensor, and a value obtained by performing a predetermined operation on the value obtained by the current sensor. That is, the first electrical quantity and the second electrical quantity include an electrical quantity per se for driving motor 3, a physical quantity correlated with the electrical quantity, or a calculated value calculated from the electrical quantity. As the first electrical quantity and the second electrical quantity, for example, at least one of a magnitude of a load current of motor 3, a differential value of the load current of motor 3, and an integral value of the load current of motor 3 is preferable. This is because the magnitude, differential value, and integral value of the load current of motor 3 correlate with and thus facilitate detecting breakage of tool 2. Breakage includes that tool 2 has a chipped cutting edge, and in addition thereto, also includes that tool 2 is broken apart. The magnitude of the load current of motor 3 is, for example, a value per se obtained by a current sensor. The differential and integral values of the load current of motor 3 are obtained, for example, by performing an operation on a load current value of motor 3 obtained by the current sensor. This operation can be performed by control unit 5, which will be described hereinafter.

When tool 2 breaks, it loses contact with workpiece 10 over a large area, and the processing per se becomes difficult. When the processing becomes difficult, the processing resistance of tool 2 decreases. When the processing resistance of tool 2 decreases, the load torque of motor 3 decreases, and accordingly, the load current of motor 3 while workpiece 10 is processed decreases in magnitude. That is, when tool 2 has broken, the load current of motor 3 decreases in magnitude.

Specifically, when tool 2 is broken apart and does not contact workpiece 10, the processing depth is zero (0). As the processing depth is zero, the magnitude, differential value, and integral value of the load current of motor 3 while workpiece 10 is processed are substantially equal to the magnitude, differential value, and integral value of the load current of motor 3 obtained when it idles. When tool 2 has a chipped cutting edge and still contacts workpiece 10, the processing depth decreases. As the processing depth decreases, the magnitude, differential value, and integral value of the load current of motor 3 while workpiece 10 is processed decrease, although they do not as much as they do when tool 2 does not contact workpiece 10. That is, the magnitude, differential value, and integral value of the load current of motor 3 while workpiece 10 is processed approach the magnitude, differential value, and integral value of the load current of motor 3 obtained when it idles. Therefore, at least one of the magnitude, differential value, and integral value of the load current of motor 3 can be used to determine whether tool 2 is appropriately processing workpiece 10, that is, whether tool 2 has broken.

[Control Unit]

Control unit 5 controls motor 3. Control unit 5 changes the rotational speed of motor 3. The rotational speed of motor 3 is set to a rotational speed corresponding to a processing condition applied before workpiece 10 is processed. The rotational speed of motor 3 is typically changed based on a difference described hereinafter. Control unit 5 is typically composed of a computer. The computer includes a processor, a memory, and the like. The memory stores a program for causing the processor to execute a control procedure, which will be described hereinafter. The processor reads and executes the program stored in the memory. The program includes a program code for a process of determining whether a calculation result of a calculation unit 51 satisfies a threshold value or less, and a process of changing the rotational speed of motor 3 based on the determination. Control unit 5 includes calculation unit 51 and a storage unit 53.

(Calculation Unit)

Calculation unit 51 calculates a difference between the first electrical quantity and the second electrical quantity. As has been discussed above, when the first electrical quantity and the second electrical quantity are each at least one of a magnitude, differential value, and integral value of the load current of motor 3, the difference to be calculated includes at least one of a difference between magnitudes of the load current, a difference between differential values of the load current, and a difference between integral values of the load current. The difference is stored in storage unit 53.

When the first electrical quantity is at least one of the magnitude, differential value, and integral value of the load current of motor 3, the first electrical quantity assumes a substantially fixed value. The first electrical quantity may be obtained in advance and stored in storage unit 53.

The first electrical quantity may be obtained for each workpiece 10 while motor 3 idles. When the first electrical quantity is obtained for each workpiece 10 while motor 3 idles, the first electrical quantity may for example be an electrical quantity of motor 3 obtained by measurement unit 4 when tool 2 is retracted farthest from workpiece 10 and thus assumes an initial position and tool 2 is also rotated by motor 3 under the same cutting condition as that when tool 2 is actually processed.

When the second electrical quantity is a magnitude of the load current of motor 3, the second electrical quantity is an average value of values of a current as obtained after tool 2 starts to process workpiece 10 before the tool completes processing the workpiece. When the second electrical quantity is a differential value of the load current of motor 3, the second electrical quantity is a differential value of the load current of motor 3 obtained immediately after tool 2 starts to process workpiece 10. "Immediately after the tool starts to process the workpiece" means a period of time elapsing after the processing starts before a maximum value of the current is reached. When the second electrical quantity is an integral value of the load current of motor 3, the second electrical quantity is an integral value of the load current obtained after tool 2 starts to process workpiece 10 before the tool completes processing the workpiece.

For example, a time when the processing starts and a time when the processing completes may be determined in advance by processing a plurality of workpieces using tool 2 unbroken, and may be stored in storage unit 53. The plurality of workpieces to be processed in advance are the same in material, shape, and size as workpiece 10 to be processed on a full-scale basis. The plurality of workpieces to be processed in advance are processed under the same processing condition as workpiece 10 to be processed on a full-scale basis. The time when the processing starts and the time when the processing completes can be determined from the load current of motor 3. The plurality of workpieces to be processed in advance may be 2-10 workpieces.

The time when the processing starts that is stored in the storage unit may be a time when the processing starts latest when the plurality of workpieces are processed. The time when the processing completes that is stored in the storage unit may be a time when the processing completes earliest when the plurality of workpieces 10 are processed. This is because the average and integral values of the load current obtained after processing workpiece 10 starts before doing so completes, and the differential value of the load current obtained immediately after processing workpiece 10 starts are less likely to include the value of the load current of motor 3 obtained while it idles. Therefore, the average and integral values of the load current obtained after processing workpiece 10 starts before doing so completes, and the differential value of the load current obtained immediately after processing workpiece 10 starts correspond to the average and integral values and differential value of the load current obtained when workpiece 10 is actually processed. The time when the processing starts that is stored in the storage unit may be updated whenever a time when processing workpiece 10 starts is delayed. Similarly, the time when the processing completes that is stored in the storage unit may be updated whenever a time when processing workpiece 10 completes is earlier.

When the difference is equal to or less than the threshold value, control unit 5 zeros the rotational speed of motor 3. When the rotational speed of motor 3 is zero, tool 2 is stopped from rotating. The threshold value may for example be a value based on the safety factor of processing system 1 or whether tool 2 enables appropriate processing. The threshold value is previously stored in storage unit 53. Timing of changing the rotational speed of motor 3 does not depend on the position of tool 2. For example, tool 2 may be moved to the initial position by driving mechanism 30 after the rotational speed of motor 3 is zero, or the rotational speed of motor 3 may be zeroed after tool 2 is moved to the initial position by driving mechanism 30. When the difference is equal to or less than the threshold value, tool 2 is broken. Accordingly, control unit 5 zeros the rotational speed of motor 3 and tool 2 is thus stopped from rotating, which prevents continuous production of defective products which have not been subjected to predetermined processing by tool 2.

When the difference exceeds the threshold value, control unit 5 does not change the rotational speed of motor 3. In that case, a next workpiece 10 is processed by tool 2 rotated while motor 3 is rotated at the same rotational speed of motor 3 as that when the immediately preceding workpiece 10 was processed.

[Control Procedure]

A control procedure by control unit 5 will be described with reference to FIG. 2. When tool 2 is rotated by motor 3, measurement unit 4 obtains the load current of motor 3 as indicated in FIG. 2 by step S1.

Figure 2:
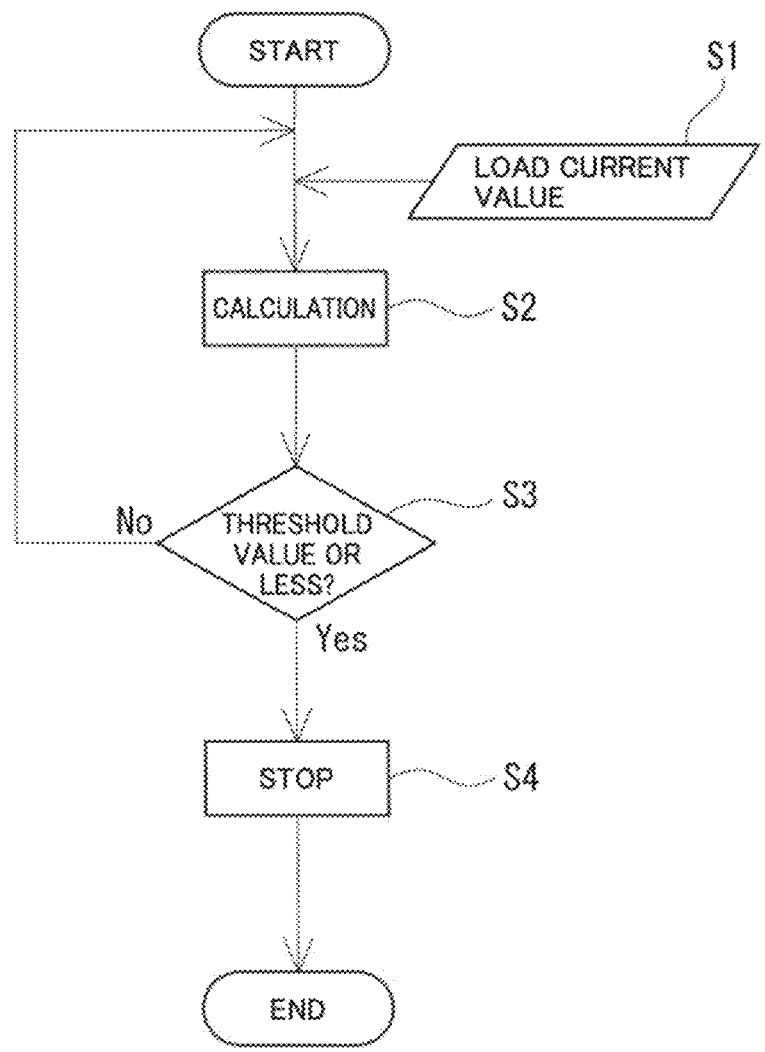
FIG. 2 is a flowchart of a control procedure for the processing system according to the embodiment.

Calculation unit 51 calculates the above-described difference, as indicated in FIG. 2 by step S2.

Control unit 5 determines whether the difference satisfies the threshold value or less, as indicated in FIG. 2 by step S3. For the sake of illustration, when a normal tool 2 is used, the threshold value is set to an intermediate value of a difference between at least one of the magnitude, differential value, and integral value of the load current obtained while workpiece 10 is processed and at least one of the magnitude, differential value, and integral value of the load current of motor 3 obtained while it idles. The intermediate value is at least one of an intermediate value of a difference between magnitudes of the load current, an intermediate value of a difference between differential values of the load current, and an intermediate value of a difference between integral values of the load current.

When step S3 satisfies the threshold value or less, control unit 5 zeros the rotational speed of motor 3 in step S4. When the rotational speed of motor 3 is zero, tool 2 is stopped from rotating. Then, the control ends. Examples of when step S3 satisfies the threshold value or less include: when a tool which is broken and unable to contact workpiece 10 is used; when a tool which is broken and still able to contact workpiece 10 is used; and the like, as will be described hereinafter more specifically.

When a negative decision is made in step S3, control unit 5 does not change the rotational speed of motor 3. That is, a next workpiece 10 is processed with motor 3 rotated at the same rotational speed of motor 3 as that when the immediately preceding workpiece 10 was processed, and processing the next workpiece 10 and steps S1 to S3 are repeated until it is determined in step S3 that the threshold value or less is satisfied. A negative decision is made in step S3 when an unbroken, normal tool is used, as will be described in detail hereinafter.

Figure 3:
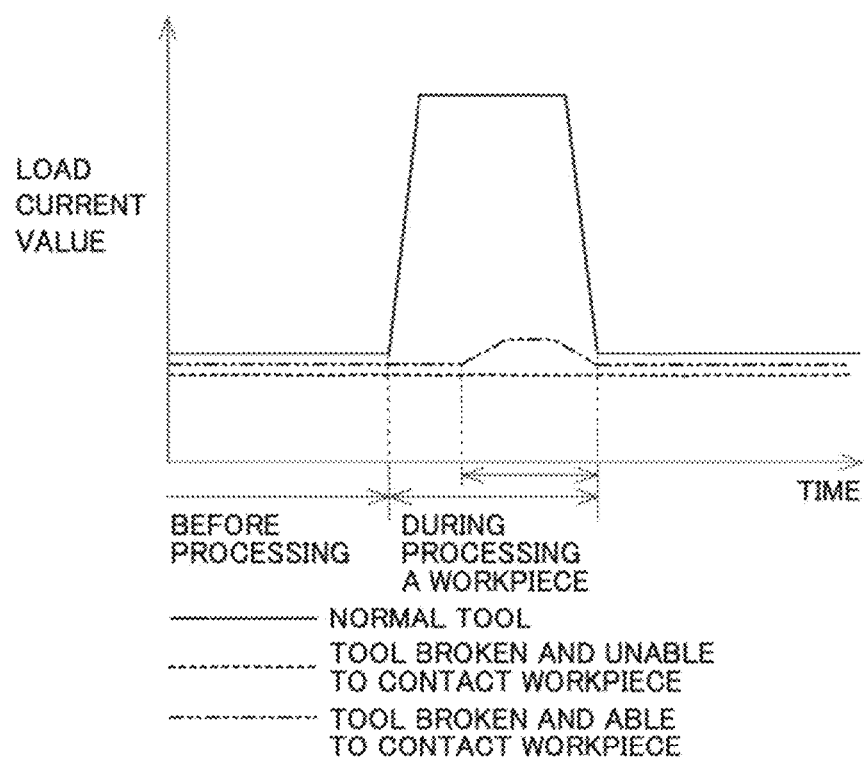
FIG. 3 is a graph showing a transition of a load current of a motor, as obtained by a measurement unit that the processing system according to the embodiment comprises.

Reference will now be made to FIG. 3 to describe a control procedure of control unit 5 for a tool which is broken and unable to contact workpiece 10, a tool which is broken and still able to contact workpiece 10, and an unbroken, normal tool. FIG. 3 represents transition of the load current of motor 3 obtained by measurement unit 4 when each above tool is used to process workpiece 10. In FIG. 3 the axis of abscissa represents time. In FIG. 3 the axis of ordinate represents the load current value. In FIG. 3 a broken line represents how the load current transitions when a tool which is broken and unable to contact work-piece 10 is used. In FIG. 3 a two-dot chain line represents how the load current transitions when a tool which is broken and still able to contact workpiece 10 is used. In FIG. 3 a solid line represents how the load current transitions when tool 2 that is an unbroken, normal tool is used. FIG. 3 represents the load current in waveforms, which are presented in a simplified manner for the sake of illustration and do not necessarily match actual waveforms.

(When a Tool Unable to Contact the Workpiece is Used)

As indicated in FIG. 3 by the broken line, the magnitude, differential value, and integral value of the load current obtained while workpiece 10 is processed are substantially the same as the magnitude, differential value, and integral value, respectively, of the load current obtained while motor 3 idles. This is because the tool unable to contact workpiece 10 cannot reach it, and the processing per se of workpiece 10 thus becomes difficult, resulting in a processing depth or zero. Calculation unit 51 calculates the above-described difference. The calculated difference substantially approaches zero. Therefore, when the difference is compared with the threshold value, the difference satisfies the threshold value or less. Control unit 5 zeros the rotational speed of motor 3 based on the result of the comparison. When the rotational speed of motor 3 is zero, tool is stopped from rotating.

(When a Tool which is Broken and Still Able to Contact the Workpiece is Used)

As indicated in FIG. 3 by the two-dot chain line, when the tool broken and still able to contact the workpiece starts to process workpiece 10 is later than when normal tool 2 starts to process workpiece 10. This is because although the tool broken and still able to contact the workpiece does reach workpiece 10, the tool takes more time to reach workpiece 10 than normal tool 2. And the magnitude, differential value, and integral value of the load current obtained while workpiece 10 is processed with the broken tool are all smaller than those obtained when normal tool 2 is used. This is because when the tool broken and still able to contact the workpiece is compared with normal tool 2, the former processes workpiece 10 less deep than the latter and accordingly, a processing resistance of tool 2 acting while workpiece 10 is processed decreases. Calculation unit 51 calculates the above-described difference. The calculated difference decreases. Therefore, when the difference is compared with the threshold value, the difference satisfies the threshold value or less. Control unit 5 zeros the rotational speed of motor 3 based on the result of the comparison.

(When Normal Tool is Used)

As indicated in FIG. 3 by a solid line, the magnitude, differential value, and integral value of the load current obtained while workpiece 10 is processed are larger than the magnitude, differential value, and integral value, respectively, of the load current obtained while motor 3 idles. This is because normal tool 2 contacts workpiece 10 over a large area and the processing resistance increases. Calculation unit 51 calculates the above-described difference. The calculated difference increases. Therefore, when the difference is compared with the threshold value, the difference does not satisfy the threshold value or less. That is, the difference exceeds the threshold value. Control unit 5 does not change the rotational speed of motor 3 based on the result of the comparison.

[Function and Effect]

Processing system 1 of the present embodiment can detect breakage of tool 2 and hence suppress production of defective products which have not been subjected to predetermined processing by tool 2.

[Method for Manufacturing Metal Member]

A method for manufacturing a metal member according to the present embodiment comprises processing with a tool a workpiece composed of the metal member. This processing may be either rough processing or finishing. Hereinafter, the processing step will be described in detail.

[Processing Step]

The processing step is performed while the measurement unit obtains the electrical quantity of the motor that rotates the tool or the workpiece. The processing step changes the rotational speed of the motor based on a difference between a first electrical quantity and a second electrical quantity. As has been described above, the first electrical quantity is an electrical quantity of the motor measured by the measurement unit while the motor idles. As has been described above, the second electrical quantity is an electrical quantity of the motor measured by the measurement unit while the workpiece is processed.

When the difference is equal to or less than the threshold value, the rotational speed of the motor is zeroed. Once the motor has been stopped from rotating, the broken tool is replaced with a new tool. The new tool subsequently processes workpieces repeatedly until the difference is equal to or less than the threshold value. On the other hand, when the difference exceeds the threshold value, the rotational speed of the motor is unchanged. In that case, the next workpiece is processed with the tool at the same rotational speed as that applied when the immediately preceding workpiece was processed. And the tool subsequently repeats processing workpieces until the difference is equal to or less than the threshold value.

[Function and Effect]

The method for manufacturing a metal member according to the present embodiment can detect breakage of a tool and hence suppress production of defective products which have not been subjected to predetermined processing by the tool. Further, the method for manufacturing a metal member according to the present embodiment can improve productivity of the metal member. This is because it is unnecessary to temporarily move the tool to a detector to check for breakage, and the checking operation can thus be eliminated.

Note that the present invention is not limited to these examples, and is intended to include any modifications within the meaning and scope indicated by and equivalent to the terms of the claims.

REFERENCE SIGNS LIST 1 processing system
2 tool
3 motor
30 driving mechanism
4 measurement unit
5 control unit
   51 calculation unit
   53 storage unit
10 workpiece
200 table

The invention claimed is:

1. A processing system comprising:
a tool that processes a workpiece composed of a metal member;
a motor that rotates the workpiece or the tool;
a control unit that controls the motor; and
a measurement unit that obtains an electrical quantity of the motor, wherein
the control unit is configured to detect an abnormality with the tool based on a difference between a first electrical quantity and a second electrical quantity, and in response to the abnormality being detected, control the motor to stop rotating,
the first electrical quantity is an electrical quantity obtained by the measurement unit while the motor rotates before the workpiece is processed, and
the second electrical quantity is an electrical quantity obtained by the measurement unit while the workpiece is processed.

2. The processing system according to claim 1, wherein the first electrical quantity and the second electrical quantity are at least one of a magnitude of a load current of the motor, a differential value of the load current of the motor, and an integral value of the load current of the motor.

3. The processing system according to claim 2, wherein under a condition the difference is equal to or less than a threshold value, the control unit detects the abnormality has occurred.

4. The processing system according to claim 1, wherein under a condition the difference is equal to or less than a threshold value, the control unit detects the abnormality has occurred.

5. The processing system according to claim 1, wherein the abnormality is an indication the tool is broken.

6. The processing system according to claim 5, wherein the control unit keeps the motor in a state of non-rotation at least until a replacement tool is substituted for the tool that is broken.

7. A method for manufacturing a metal member, comprising:
processing a workpiece composed of the metal member by using a tool while obtaining by a measurement unit an electrical quantity of a motor that rotates the tool or the workpiece, wherein
the processing includes detecting an abnormality with the tool based on a difference between a first electrical quantity and a second electrical quantity, and in response to detecting the abnormality, controlling the motor to stop rotating,
the first electrical quantity is an electrical quantity obtained by the measurement unit while the motor rotates before the workpiece is processed, and
the second electrical quantity is an electrical quantity obtained by the measurement unit while the workpiece is processed.

8. The method of claim 7, wherein the first electrical quantity and the second electrical quantity are at least one of a magnitude of a load current of the motor, a differential value of the load current of the motor, and an integral value of the load current of the motor.

9. The method of claim 8, wherein
under a condition the difference is equal to or less than a threshold value, the detecting including detecting that the abnormality has occurred.

10. The method of claim 7, wherein
under a condition the difference is equal to or less than a threshold value, the detecting including detecting that the abnormality has occurred.

11. The processing method according to claim 7, wherein the abnormality is an indication the tool is broken.

12. The processing method according to claim 11, wherein the controlling comprises keeping the motor in a state of non-rotation at least until a replacement tool is substituted for the tool that is broken.

13. A processing system comprising:
a tool that processes a workpiece composed of a metal member;
a motor that rotates the workpiece or the tool;
control circuitry comprising a computer that controls the motor; and
a sensor that obtains an electrical quantity of the motor, wherein
the control circuitry is configured to detect an abnormality with the tool based on a difference between a first electrical quantity and a second electrical quantity, and in response to the abnormality being detected, control the motor to stop rotating,
the first electrical quantity is an electrical quantity obtained by the sensor while the motor rotates before the workpiece is processed, and
the second electrical quantity is an electrical quantity obtained by the sensor while the workpiece is processed.

14. The processing system according to claim 13, wherein the first electrical quantity and the second electrical quantity are at least one of a magnitude of a load current of the motor, a differential value of the load current of the motor, and an integral value of the load current of the motor.

15. The processing system according to claim 14, wherein under a condition the difference is equal to or less than a threshold value, the control circuitry detects the abnormality has occurred.

16. The processing system according to claim 13, wherein under a condition the difference is equal to or less than a threshold value, the control circuitry detects the abnormality has occurred.

17. The processing system according to claim 13, wherein the abnormality is an indication the tool is broken.

18. The processing system according to claim 17, wherein the control circuitry keeps the motor in a state of non-rotation until a replacement tool is substituted for the tool that is broken.

* * * * *